United States Patent [19]

Fulton et al.

[11] 3,936,677

[45] Feb. 3, 1976

[54] SUPERCURRENT DEVICE FOR CONTROLLING MOBILE FLUX VORTICES

[75] Inventors: Theodore Alan Fulton, Warren Township, Somerset County, N.J.; John Kirtland Galt, Albuquerque, N. Mex.

[73] Assignee: Bell Telephone Laboratories, Incorporated, Murray Hill, N.J.

[22] Filed: Jan. 21, 1975

[21] Appl. No.: 542,712

[52] U.S. Cl. .............. 307/306; 307/245; 307/277; 357/5
[51] Int. Cl.² ................. H03K 3/38; H03K 19/195; H03K 17/92
[58] Field of Search ........... 307/212, 245, 277, 306; 357/5; 335/216; 338/32 S

[56] References Cited
UNITED STATES PATENTS

| 3,689,780 | 9/1972 | Meissner et al. | 357/5 X |
| 3,691,539 | 9/1972 | Erben et al. | 307/306 X |

*Primary Examiner*—John Zazworsky
*Attorney, Agent, or Firm*—M. J. Urbano

[57] ABSTRACT

In an elongated weak-link supercurrent transmission line, the propagation of mobile flux vortices can be either enhanced or impeded by control means comprising a normal metal segment which interrupts either superconductor in the direction of vortex propagation and a control current source connected to the line at a point in operative relation to the normal metal segment. The control means either enhances or impedes the propagation of a vortex depending on the direction of the control current relative to that of the supercurrent associated with the vortex. The control means may also include a portion of the line in which its width is varied in order to change the velocity of the vortices. Also described is a switching device in which the transmission line is bifurcated and control means is located in each path to selectively block or transmit vortices, as well as a memory device in which the transmission line is formed in a closed loop and the normal metal segment serves to prevent the creation of anti-vortices in the loop.

17 Claims, 11 Drawing Figures

SUPERCURRENT DEVICE FOR CONTROLLING MOBILE FLUX VORTICES

BACKGROUND OF THE INVENTION

This invention relates to elongated weak-link supercurrent devices and, more particularly, to controlling the propagation of mobile flux vortices in such devices.

In U.S. Pat. No. 3,676,718 granted to P. W. Anderson, R. C. Dynes and T. A. Fulton on July 11, 1972, there are described a variety of weak-link supercurrent logic devices which are capable of sustaining one or more trapped magnetic field (flux) vortices. In an extended Josephson junction (SIS) device, that is, one which is long in the $x$-direction compared to the Josephson penetration depth $\lambda_J$, the patent teaches that a vortex is induced by a spatial variation of the supercurrent $J(x,y)$ in which a positive supercurrent flows through the I-layer and into the contiguous superconductor to a depth of about $\lambda_L$, the London penetration depth, then along the superconductor a distance of about $2\lambda_J$, thence through the I-layer again as a negative supercurrent into the opposite superconductor to a depth of about $\lambda_L$ and finally back to the point of beginning. Such a vortex supports a net magnetic flux of precisely $\Phi_o = 2.07 \times 10^{-15}$ W$b$, the well-known flux quantum. As defined in the patent, the term vortex means an entity which includes both the circulating supercurrent $J(x,y)$ and the flux quantum $\Phi_o$ induced thereby.

Once created, the patent states, a vortex prefers to position and distribute itself in a region so that a local minimum of the sum of the magnetic energy plus the Josephson coupling energy is established. Where a plurality of such preferred locations are present in a single weak-link structure, it is possible to move the vortex from one such location to another by applying a force thereto as, for example, by applying a local current or magnetic field to a region near to the vortex.

In contrast, if the structure in which the vortex is created has no local minima of energy over an extended length in the direction of propagation ($x$-direction), then once set in motion the vortex will propagate at a velocity, and to a distance, determined by damping processes (e.g., single particle tunneling). This kind of structure could function as a transmission line on which information is carried in the form of a plurality of sequential vortices. At some point along the line it might be desirable to exercise various forms of control over the vortices. For example, to overcome damping processes in the line, it would be desirable to accelerate vortices which have slowed down. To perform logic functions, on the other hand, it might be necessary to switch selected vortices from one transmission path to another. Yet another application arises where the transmission line forms the vortex storage medium of a circulating memory. In the latter case, control is exercised both at the input, where vortices are introduced, and at some point in the transmission line to maintain constant the velocity and/or spacing of the vortices.

SUMMARY OF THE INVENTION

In accordance with an illustrative embodiment of our invention, in an enlongated weak-link supercurrent transmission line, the propagation of mobile flux vortices can be either enhanced or impeded by control means comprising a normal metal (N) segment which interrupts either, or both, superconductors in the direction of propagation. Thus, in an SIS structure the portion of the line which includes the N segment can be either SIN or NIN. In the latter case the normal metal used to interrupt one superconductor need not be the same as that which interrupts the other superconductor.

The N segment can be designed, relative to the vortex velocity, so that when a vortex propagating along the transmission line reaches the N segment it is not transmitted further, i.e., it is blocked. However, a suitable control current applied to the line at a point in operative relation to the N segment, and in the same direction as the proximate portion of an approaching vortex, causes the vortex to propagate through the segment. Conversely, the N segment can be designed so that a vortex will normally be transmitted through the segment. In the latter case, a suitable control current applied to the line at a point in operation relation to the N segment, and in the opposite direction from the proximate portion of an approaching vortex, causes the vortex to slow down and to be trapped at the N segment where it dissipates itself, i.e., it is effectively blocked.

Thus, the N segment and the control current source cooperate to function as a switch which either fully transmits (with or without change in velocity) or fully blocks propagating vortices. The desired function defines at what point in line the control current is to be applied so that it is in operative relation to the N segment. For example, in one case the N segment is designed to fully block the vortices, and the direction of the control current, applied at a point downstream of the N segment, is such that vortices would be accelerated. Then, in order for the control current to be able to accelerate a vortex through the N segment, it should be applied near to the N segment so that the vortex "sees" the control current. In this regard "near to" means within a distance which is less than about $2\lambda_J$ to $3\lambda_J$, the approximate length of the vortex. In other cases where the control current is designed to accelerate vortices from a point upstream of a blocking N segment, or in the case where the N segment at least partially transmits vortices, the control current can be applied at a point remote from the N segment, i.e., at a distance much greater than $2\lambda_J$ to $3\lambda_J$ therefrom.

An illustrative application of the foregoing principles is a switching device in which a main transmission line is bifurcated and control means (a normal metal segment in conjunction with a control current source) is located in each path. Vortices propagating along the main transmission line can be switched to either path by operation of an appropriate one of the control means. Of course, propagation in neither path (fully blocked mode) or both paths (fully transmitted mode) is also possible.

It should be noted that the control current, which interacts with the supercurrent of the vortex, can be replaced by a magnetic field control which interacts with the magnetic field of the vortex to either attract or repel the vortex. Moreover, the control means may also include a portion of the line in which the width is either greater or less than the remainder of the line in order to change the velocity of a vortex propagating therethrough.

BRIEF DESCRIPTION OF THE DRAWING

The various embodiments of our invention, together with their features and advantages, can be readily understood from the following more detailed description taken in conjunction with the accompanying drawing in which.

DETAILED DESCRIPTION

Figure 1:
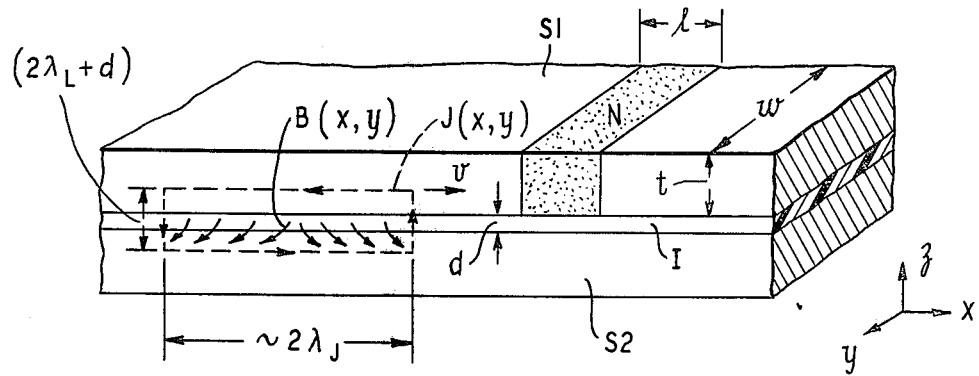
FIG. 1 is a pictorial view of a supercurrent transmission line including a normal metal segment.

Before discussing detail the various embodiments of our invention, it will be helpful to consider first the motion of a flux vortex as it propagates along a supercurrent transmission line including a normal metal (N) segment as shown in FIG. 1.

The transmission line is an extended weak-link structure, typically of the SIS type, in which the length of the line in the direction of vortex propagation ($x$-direction) is much greater than the Josephson penetration depth $\lambda_J$. The vortex, generated by a current source not shown is characterized by a circulating supercurrent $J(x,y)$ and a magnetic field $B(x,y)$ supported thereby. The supercurrent supports precisely one flux quantum $\Phi_0$. The length of the vortex is about $2\lambda_j$, that is, probably about fifty percent of the supercurrent is confined to a length of about $2\lambda_J$ whereas about seventy percent or more is confined within $3\lambda_J$. The width of the vortex in the $z$-direction is about $(2\lambda_L+d)$, where $\lambda_L$ is the London penetration depth and $d$ is the thickness of the weak-link (i.e., the insulator I in an SIS structure) which separates superconductors S1 and S2.

The vortex propagates with a velocity $v$ toward a normal metal segment N which interrupts the upper superconductor S1. The segment N has length, width and thickness $1$, $w$ and $t$ respectively, If the resistivity of the segment is $\rho$, then its resistance is $$R = \frac{\rho\, 1}{w\, t} \tag{1}$$

For simplicity of calculation, let us asume that the length of the normal metal segment is much smaller than that of the vortex, i.e., $1 << 2\lambda_J$. Skin depth variations in R are neglected. The static case can then be analyzed as follows. Suppose the vortex is sitting, not moving, astride the N segment. The current loop $J(x,y)$ of the vortex and its associated flux $\Phi_0$ will decay away because of ohmic losses in the N segment. This decay time $\tau$ is calculated as follows.

The maximum current $I_m$ flowing in the vortex current loop is given by $$I_m = \frac{1}{\pi} \Phi_o / (\lambda_J L) \tag{2}$$

where L, the inductance per unit length of the junction, is $$L = \mu_o (2\lambda_L + d)/w \tag{3}$$

and $\mu_o$ is the permeability of free space.

The power P dissipated by Joule heating is $$P = R I_m^2 \tag{4}$$

where R, the resistance of the N segment, is given by equation (1), and is equivalent to the rate of energy loss E of the vortex, i.e., $$P = -dE/dt \tag{5}$$

On the other hand the vortex potential energy $E_o$ is given by $$E_o = \frac{2}{(\pi)^2} \frac{\Phi_o^2}{L\lambda_J} \tag{6}$$

Therefore, the initial fractional rate at which the vortex energy is consumed is, combining equations (2), (4), (5) and (6), $$-\frac{dE/dt}{E_o} = -\frac{P}{E_o} = -\frac{R I_m^2}{E_o} \tag{7}$$

$$= -R \frac{\frac{1}{(\pi)}2\, \Phi_o^2/(\lambda_J L)^2}{\frac{2}{(\pi)}2\, \Phi_o^2/(\lambda_J L)} \tag{8}$$

$$= \frac{R}{2\lambda_J L} \tag{9}$$

From the equation (9) it can be seen that the characteristic decay time $\tau$ is $2L\lambda_J/R$ which is analogous to an L/R — type decay time of inductance — resistance electronic circuits. Substituting the inductance — resistance equations (3) and (1), we get the expression for the decay time as $$\tau = \frac{2L\lambda_J}{R} = \left[\frac{2\mu_o(2\lambda_L+d)}{\rho/t}\right]\frac{\lambda_J}{1} \tag{10}$$

Illustratively $2\lambda_L+d = 10^{-7}$m (0.1 $\mu$m), $t = 3\times10^{-7}$m (0.3 $\mu$m), $\rho = 10^{-8}\Omega$-m ($10^{-6}\Omega$-cm) so that $$\tau = 6\times10^{-12}\lambda_J/1 \text{ sec.} \tag{11}$$

Typically $\lambda_J$ is about 10 $\mu$m and if $1 = 2$ $\mu$m, then the decay time is about 30 picoseconds.

Next, let us assume that, instead of a stationary vortex setting astride the N segment, the vortex is moving in the x-direction with a velocity $v$ as it reaches the N segment. We desire to estimate whether the vortex will be stopped by the N segment, and be dissipated in a characteristic decay time given by equation (10), or whether it has sufficient energy to propagate through the N segment with just a reduction in velocity.

The total energy $E_T$ of a moving vortex is given by $$E_T = E_o \left(1 - \frac{v^2}{c^2}\right)^{-\frac{1}{2}} \quad (12)$$

where $E_o$ is the potential energy given by equation (6) and $c$ is the velocity of light in the junction. For example, $v$ might be equal to $0.5c$ in which case $E_T = 1.15 E_o$.

If we now assume that the rate of energy loss calculated above applies all the time that the work the vortex is crossing the N segment, then the total energy loss $E_{loss}$ is given by $$E_{loss} = RI_m^2 t_c = (E_o/\tau) t_c \quad (13)$$

where $t_c$ is the time it takes the vortex to cross the N segment.

For the case we are analyzing, that is $1 \ll \lambda_J$, $t_c$ is approximately $$t_c \approx \lambda_J/v \quad (14)$$

Substituting equation (10) for $\tau$ and equation (14) for $t_c$ into equation (13), we get $$E_{loss} = E_o \left(\frac{\lambda_J}{v\tau}\right) = \frac{\rho l/t}{2\mu_o(2\lambda_L+d)v} \quad (15)$$

In order for the vortex to cross the N segment without being totally dissipated, i.e., with only velocity reduction, we want the energy loss to be less than the kinetic energy $E_k$ of the vortex; that is $$E_{loss} < E_k \quad (16)$$

The kinetic energy is just $$E_k = E_T - E_o. \quad (17)$$

Substituting equation (12) for $E_T$ we get $$E_k = \left[\left(1 - \frac{v^2}{c^2}\right)^{-\frac{1}{2}} - 1\right] E_o \quad (18)$$

Thus, the condition for vortex propagation through the N segment is obtained by substituting equations (15) and (18) into inequality (16):

$$\frac{\rho l/t}{2\mu_o(2\lambda_L+d)v} < E_o \left[\left(1 - \frac{v^2}{c^2}\right)^{-\frac{1}{2}} - 1\right] \quad (19)$$

or, in terms of the parameters of the N segment alone, $$\frac{\rho l}{t} < E_o \left[\left(1 - \frac{v^2}{c^2}\right)^{-\frac{1}{2}} - 1\right] 2\mu (2\lambda_L+d)v. \quad (20)$$

Note that this expression is independent of the width $w$ of the N segment.

For purposes of illustration, assume the same parameters used to calculate the decay time of equation (11), $\tau = 6 \times 10^{-12} \lambda_J/1$ sec., and in addition that $v = 0.5c$, $c = 2 \times 10^7$ m/sec so that $E_T = 1.15 E_o$ and $E_k = 0.15 E_o$.

Then for $\lambda_J = 10$ μm, the energy loss from equation (15) is $$E_{loss} = E_o \frac{l/v}{6 \times 10^{-12}}. \quad (21)$$

Thus, if the length of the N segment is $l = 10$ μm, then $l/v = 1 \times 10^{-12}$ sec and the energy dissipated is about equal to the kinetic energy. On the other hand, for $l = 1$ μm the vortex would propagate through the N segment with only about ten percent loss in kinetic energy, whereas for $l = 20$ μm the vortex would be stopped and subsequently be totally dissipated.

The principles discussed above apply equally as well to vortex motion in the case where $l \geq \lambda_J$. However, the calculations are more difficult and the resulting expressions which describe the energy conditions are more complex. Therefore, in the interests of simplicity only the case $l \ll \lambda_J$ has been analyzed in detail herein.

Next let us consider the case where an external force is applied to a vortex and the effect of that force on the conditions which describe whether or not the vortex will be dissipated by the N segment. Assuming that the vortex propagates past the point of application of the external force, the kinetic energy of the vortex changes by an amount $\Delta E_k$. Then inequality (16) describing the condition for a vortex to propagate through an N segment becomes $$E_{loss} < E_k + \Delta E_k \quad (22)$$

if the force increases the vortex velocity and $$E_{loss} < E_k - \Delta E_k \quad (23)$$

if the force decreases the vortex velocity. If on the other hand, the vortex fails to propagate past the point of application of the force, and is consequently repelled, there is no change in its kinetic energy but only a change in its direction (analogous to a ball which is rolled up a frictionless hill but fails to get to the top).

The manner in which the foregoing principles are implemented in accordance with various embodiments of our invention will now be discussed.

Figure 2:
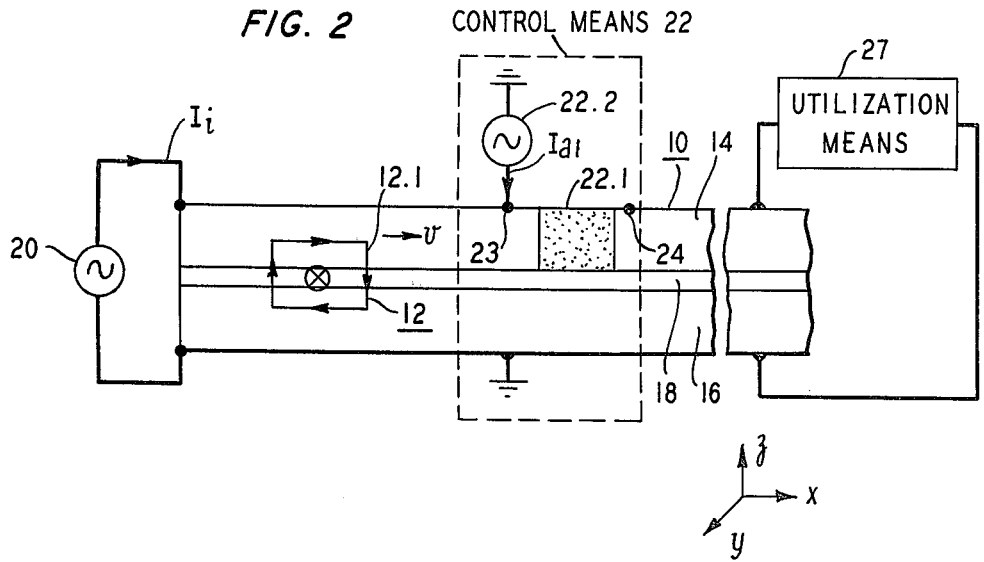
FIG. 2 is a schematic side view of an illustrative embodiment of our invention for controlling the propagation of vortices in a weak-link transmission line.

Turning to FIG. 2, there is shown, in accordance with an illustrated embodiment of our invention, a weak-link supercurrent transmission line 10 capable of supporting a propagating flux vortex 12. The transmission line 10 comprises a pair of superconductive layers 14 and 16 separated by a layer 18 (the "weak-link") which is thin enough to permit two-particle tunneling therethrough. Layer 18 is typically an insulator, thus forming an SIS structure of the type described by J. M. Rowell in U.S. Pat. No. 3,281,609 (e.g., Pb-PbO-Pb). By means not shown, but well known in the art, the transmission line 10 is maintained at a cryogenic temperature below the critical (transition) temperature of superconductive layers 14 and 16.

Vortices are generated at one end of the transmission line 10 by means of an input current source 20 in the manner described in the aforementioned U.S. Pat. 3,676,718. That is, the input current $I_i$ from source 20 is maintained below the critical supercurrent $I_c$ of the weak-link structure so that during operation the structure is at all times in a supercurrent state. However, the input source 20 may be pulsed in order to produce a train of input current pulses $I_i$ each of which in turn generates a separate vortex. Each vortex 12, which propagates in the x-direction with a velocity $v$ and to a distance determined by damping processes, is characterized by a circulating supercurrent J(x,y) and a magnetic field B(x,y) induced thereby (see FIG. 1). The magnetic field has associated with it a well-known flux quantum $\Phi_o$.

In accordance with one embodiment of our invention, the propagation of a vortex 12 along transmission line 10 can be either enhanced or impeded by control means 22 positioned between input source 20 and utilization means 27. The latter is located illustratively at an intermediate point of the transmission line 10 or at its remote end depending on system design or functional considerations. Illustratively, utilization means 27 comprises a supercurrent magnetometer of the quantum interference type described in U.S. Pat. No. 3,676,718 (FIG. 10A), also known by the acronym SQUID, Superconducting QUantum Interference Device.

Figure 7A:
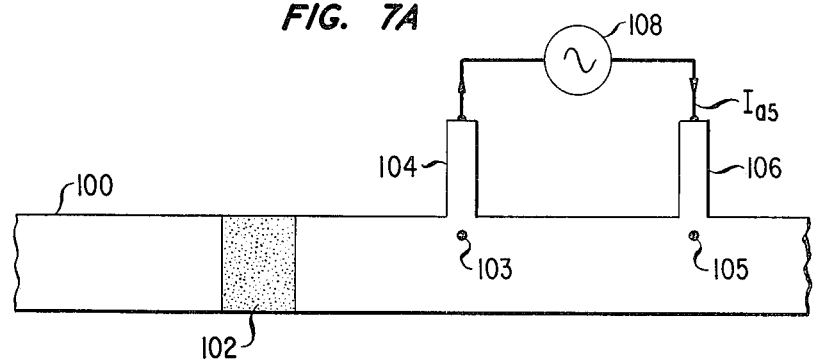
FIG. 7A is a schematic top view of another embodiment of our invention for generating the control current in a weak-line transmission line.

Control means 22 comprises a normal metal (N) segment 22.1 which interrupts superconductor 14 and a control current source 22.2 which is connected across superconductor 14 and 16 at a point in operative relation to N segment 22.1. The term normal metal is intended to include not only metals which are not superconductors at any temperature but also those which are superconductors but have a transition temperature below the operating temperature of the transmission line. Depending on the desired function, N segment 22.1 may alternatively interrupt superconductor 16 but would function in the same manner as the device of FIG. 2, or interrupt both superconductors (FIG. 3), which merely doubles the resistance of the N segment. Also, the control current source may be connected on the side of the normal metal segment proximate the input end of the transmission line (FIG. 2) or proximate the output end (FIG. 7A). Moreover, the sign of the control current may be either the same as that in the proximate portion of an approaching vortex (in FIG. 2 compare the direction of the current in portion 12.1 of vortex 12 with that of control current $I_{a1}$), or opposite thereto (in FIG. 3 compare the direction of the current in portion 12.1' of vortex 12' with that of control current $I_{a2}$).

The distinction between these two cases is important because the direction of control current $I_{a1}$ of control means 22 of FIG. 2 causes the vortex 12 to be attracted toward the region where $I_{a1}$ is applied, i.e., in the + x-direction. This attraction increases the velocity of the vortex and makes its net change in kinetic energy (equal to $\Phi_o \cdot I_{a1}$) positive. Therefore, inequality (22) describes the condition for propagation of vortex 12 through N segment 22.1 of FIG. 2. Functionally, therefore, control current $I_{a1}$ acts as an amplifier.

Note that in FIG. 2 control current $I_{a1}$ is applied to line 10 at a point 23 which appears to be very near to N segment 22.1 only for compactness of illustration. In practice point 23 may be remote from N segment 22.1, i.e., much more than $2\lambda_J$ away, and still be in operative relation therewith as long as it is not so far distant that damping in the line will slow down the vortex to the point where it would be blocked by the N segment. On the other hand, assuming N segment 22.1 is designed to normally block the vortex, and control current $I_{a1}$ is applied in the same direction but at point 24 downstream of N segment 22.1, then in order for the vortex 12 sitting astride the N segment to "see" the attractive force of the control current, the latter should be applied near to the N segment, i.e., at a distance which is less than about $2\lambda_J$ to $3\lambda_J$.

Figure 3:
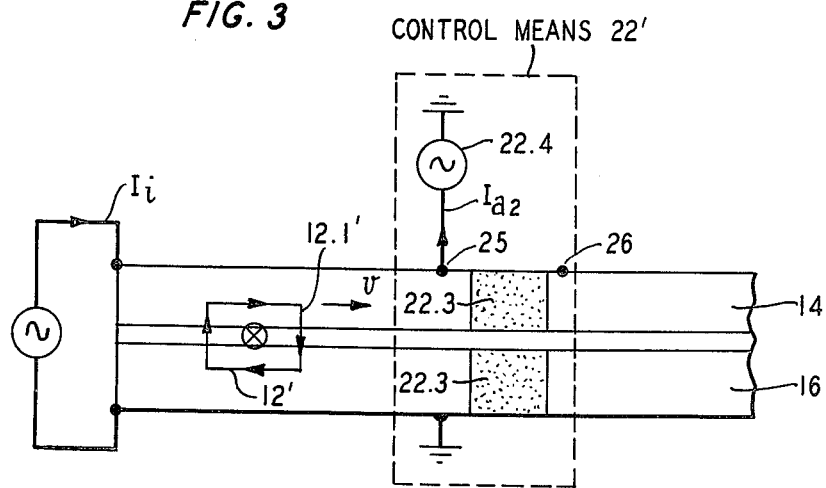
FIG. 3 is a schematic side view of another embodiment of our invention for controlling the propagation of vortices in a weak-link transmission line.

In contrast, in FIG. 3 control current $I_{a2}$ of control means 22' causes vortex 12' to be repelled away from the region where $I_{a2}$ is applied, i.e., in the — x-direction. Assuming the vortex 12' passes through the point 25 where $I_{a2}$ is applied, this repulsion decreases the velocity of the vortex and makes its net change in kinetic energy (equal to $\Phi_o \cdot I_{a2}$) negative. Therefore inequality (23) describes the condition for propagation of vortex 12' through N segment 22.3 of FIG. 3. Functionally, therefore, control current $I_{a2}$ acts as an attenuator.

Alternatively, control current $I_{a2}$ may be applied in the same direction but at point 26 downstream of N segment 22.3. In this case, $\Phi_o I_{a2}$ would be made greater than the kinetic energy of the vortex (i.e., its value as reduced after transversing N segment 22.3) so that the vortex 12' will be reflected without change in velocity. However, N segment 22.3 would be designed so that the velocity reduction caused by the first transversal of the N segment 22.3 in the + x-direction would be sufficient to prevent the vortex from transversing the N segment in the — x-direction.

In either arrangement of FIG. 3, in order for the control current to be in operative relation with the N segment, the two need not be positioned "near to" one another, but as described above with reference to one of the embodiments of FIG. 2, may be more than about $2\lambda_J$ to $3\lambda_J$ apart.

From a logic standpoint, the embodiment of FIG. 2 may operate as a normally open switch, for example. That is, using the energy principles previously described, N segment 22.1 is designed so that, in the absence of control current $I_{a1}$ applied at point 23 and for a given vortex velocity, vortex 12 is stopped, i.e., it cannot propagate through N segment 22.1 to reach utilization means 27. In order to close the switch, current source 22.2 of control means 22 is turned on when vortex 12 reaches the region of point 23 in the transmission line. Alternatively, taking into account the duration of the control current (e.g., current pulse), one may also turn on source 22.2 before vortex 12 reaches point 23. A vortex is within the "region" of a point when it is approximately $2\lambda_J$ to $3\lambda_J$ away or nearer. Current $I_{a1}$ imparts sufficient additional kinetic energy (velocity) to vortex 12 to enable it to transverse N segment 22.1 without being severely dissipated. The amount of dissipation that can be tolerated is a design consideration dependent on the magnitude of damping processes in the line 10 and the presence (or absence) of amplifiers elsewhere along the line.

Alternatively, the embodiment of FIG. 3 may operate as a normally closed switch. Once again, using the foregoing energy principles, N segment 22.3 is designed so that, in the absence of control current $I_{a2}$ applied at point 25 and for a given vortex velocity, vortex 12' can traverse N segment 22.3 without severe dissipation and can, with perhaps assistance from amplifiers along line 10, reach utilization means (not shown). In order to open the switch, current source 22.4 of control means 22' is turned on when vortex 12' reaches the region of point 25 in the transmission line. Current $i_{a2}$ tends to repel vortex 12', but does not block it, thereby reducing its kinetic energy and causing it to be dissipated by N segment 22.3.

Figure 4:
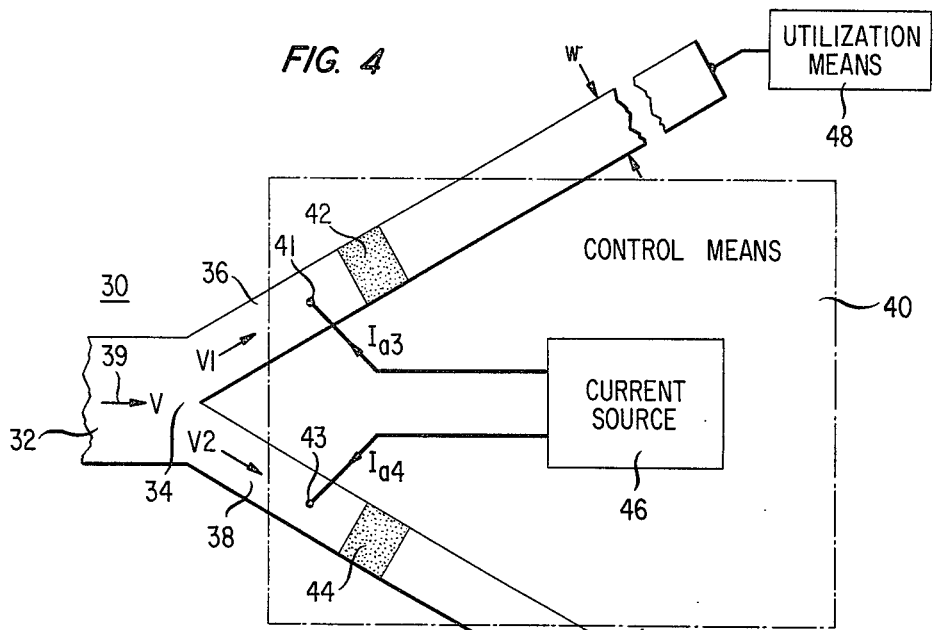
FIG. 4 is a schematic top view of still another embodiment of our invention, a device for switching vortices from a main transmission line onto one or more separate transmission paths.

The logic devices of FIG. 2 or FIG. 3 may be combined in numerous ways to perform a variety of logic functions. In particular, a vortex steering device 30, also a form of switch, is shown in FIG. 4. Device 30 comprises a main transmission line 32 which is bifurcated at region 34 (in fan-out fashion) into a pair of separate transmission paths 36 and 38. A vortex V propagating in the direction of the arrow 39, upon reaching region 34, splits into a pair of vortices V1 and V2 propagating respectively along paths 36 and 38. Control means 40 determines whether the vortices V1 and V2 reach utilization means 48 and 50 connected at the output ends of paths 36 and 38 respectively. Control means 40 comprises a pair of N segments 42 and 44 located respectively in paths 36 and 38 in combination with a current source 46 which supplies at suitable predetermined times a control current pulse $I_{a3}$ to path 36 at a point 41 in operative relation to N segment 42 and a control current pulse $I_{a4}$ to path 38 at a point 43 in operative relation to N segment 44. The meaning of the phrase "in operative relation" is the same as that defined with reference to FIGS. 2 and 3.

In operation, let us assume that control means 40 functions in a manner analogous to the normally closed switch of FIG. 3. That is, in the absence of control current pulses $I_{a3}$ and $I_{a4}$ vortex V has sufficient kinetic energy so that it splits at region 34 into vortices V1 and V2 which propagate along paths 36 and 38 traversing N segments 42 and 44 to utilization means 48 and 50, respectively. However, using in source 46 suitable electronic timing circuits well known in the art, a pulse $I_{a3}$ may be applied as vortex V1 approaches point 41, thereby causing vortex V1 to be blocked by N segment 42. Thus, only utilization means 50 detects a vortex (i.e., V2). Conversely, current pulse $I_{a4}$ may be applied to block vortex V2, or both $I_{a3}$ and $I_{a4}$ may be applied to block both V1 and V2.

Two aspects of the vortex steering embodiment of FIG. 4 deserve further explanation. First, depending on its kinetic energy, a vortex may be totally reflected at region 34, if it is traveling too slowly, or may split into two vortices, one in each path. Second, if splitting occurs, the total energy of vortex V redistributes itself between the kinetic and potential energy of vortices V1 and V2. Assuming for simplicity that main line 32 and paths 36 and 38 are identical to one another, then the creation of two vortices from a single vortex at region 34 requires additional potential energy. Since energy must be conserved, this additional energy comes from a transfer of kinetic energy to potential energy. Therefore, the vortices V1 and V2 travel slower than vortex V. Although the vortices can be amplified as previously described, their changed velocity should be taken into account in the design of control means 40 (i.e, the design of N segments 42 and 44 and source 46).

On the other hand, the paths 36 and 38 can be constructed so that vortices V1 and V2 have the same velocity as vortex V. For example, the width w of paths 36 and 38 can be reduced so that less potential energy is required to sustain vortices V1 and V2; i.e., so that potential energy of vortex V is equal to the sum of the potential energies of vortices V1 plus V2. In this manner, no transfer of kinetic energy to potential is required and hence there is no change in velocity.

Figure 5A:
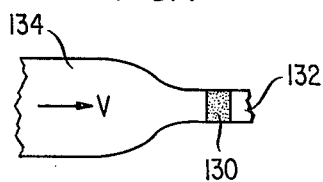
FIGS. 5A and 5B are schematic top views of other embodiments of our invention in which the width of the main line is varied in order to change the velocity of a vortex.
Figure 5B:
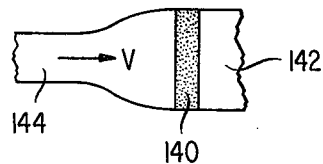

Similarly variations in width of the transmission line can be readily incorporated into the control means of the various embodiments in order to effect changes in kinetic energy of vortices in a passive manner in addition to the changes effected in an active manner by the application of control currents to the line. For example, in FIG. 5A there is shown a top view of an illustrative embodiment of our invention in which an N segment 130 is located in a thinner portion 132 of a transmission line and downstream from thicker portion 134. As a result, in traveling from portion 134 to 132 vortex V gains kinetic energy. Depending on the design function, such additional energy can be made sufficient to permit the vortex to traverse N segment 130 with or without the application of a control current previously described. Alternatively, in FIG. 5B an N segment 140 might be located in a thicker portion 142 of a transmission line and downstream from thinner portion 144. As a result, in traveling from portion 144 to 142 vortex V loses kinetic energy, assuming it has sufficient kinetic energy to enter portion 142. Once again this decrease in energy can be made sufficient to prevent the vortex from transversing N segment 140 with or without the application of a control current.

Figure 6:
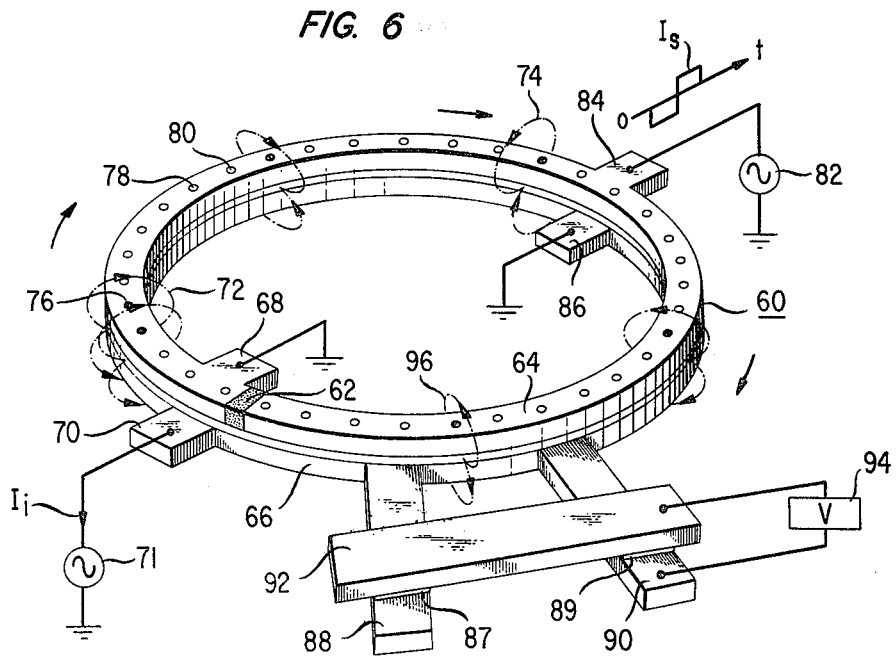
FIG. 6 is a schematic pictorial view of a vortex memory system in accordance with another embodiment of our invention.

In addition to logic functions, our invention can be utilized to perform memory functions as well. One such embodiment is depicted in FIG. 6, a dynamic memory system comprising an SIS supercurrent transmission line 60 formed in the shape of a closed loop which includes an N segment 62 shown illustratively as interrupting only the topmost superconductive layer 64. Adjacent N segment 62 are a pair of contact appendages 68 and 70 extending respectively from the upper and lower superconductive layers 64 and 66 of line 60. An input current source 71 is connected across appendages 68 and 70. Source 71 produces a train of current pulses $I_i$ which may be pulse code modulated with information to be stored by means well known in the art. These current pulses are converted to spaced vortices, such as 72 and 74, which propagate clockwise around the closed loop transmission line 60. On the top surface of layer 64 there are uniformly spaced dots and open circles which schematically represent memory locations; that is, the presence and absence of a vortex respectively. Thus, dot 76 indicates the presence of vortex 72 whereas open circles 78 and 80 indicate the absence of vortices. In binary notation, therefore, a dot corresponds to logical one and an open circle to logical zero. With this coding the memory system may store a word or frame defined by a sequence of dots and open circles. The number of bits that can be stored is approximately $L/2\lambda_J$ where L is the average loop circumference.

The memory system of FIG. 6 is dynamic in the sense that the memory locations (i.e., the vortices) are not stationary, rather they propagate around the loop at a characteristic vortex velocity $v$ previously described (e.g., $v = 0.5c$). Inasmuch as vortices are magnetic in nature, their mutual repulsion (or attraction) may cause drifting in the sense that different vortices may move at different velocities. This effect would have the tendency of changing the memory locations relative to one another, especially after numerous (e.g., $10^6$) transists around the loop. In order, however, to maintain the integrity of the information in the memory system, these relative locations (i.e., the distances between adjacent vortices) should be substantially constant or at least correctable at predetermined times to be made constant over some time interval (e.g., over the loop transit time).

Figure 9:
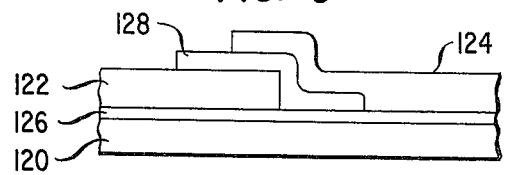
FIG. 9 is a schematic view of another structure for producing the normal metal segment of the control means in accordance with still another embodiment of our invention.

The problem of vortices drifting in the loop can be handled in several ways. In one embodiment, the dynamic nature of loop is maintained and the vortex velocity is periodically adjusted by a synchronous control source. In another embodiment, the loop is made to be quasi-static in nature by incorporating into the transmission line periodically spaced "preferred locations" (see, U.S. Pat. No. 3,676,718) which act as stationary memory locations. As discussed at column 4, lines 14–41 of that patent, preferred locations can be created in a number of ways including periodically varying the thickness of the weak-link layer in an SIS structure, using point sources of magnetic field or locally applied currents at periodic locations of the structure, or periodically varying the self-inductance per unit length of the structure. Self-inductance can be varied as shown in FIG. 9 of the patent or, alternatively, by varying the thickness of at least one of the superconductors so that in each memory location it is less about $2\lambda_L$. The periodic position of such preferred locations would correspond to the dots and circles of FIG. 6 which is this case would be stationary.

Returning to the embodiment in which vortex velocity is synchronously adjusted, consider again FIG. 6 and the synchronous control source 82 which is connected across another pair of appendages 84 and 86 which extend respectively from superconductive layers 64 and 66. The precise location of the appendages in the loop is not critical. Control source 82 generates current pulses $I_s$ at a frequency which is an integral multiple of the inverse loop transit time i.e., $$f_s = nv/L \qquad (24)$$

where $n$ is equal to the number of preferred locations in the loop, $v$ is the vortex velocity and L is the length (average circumference) of the loop. Using the well-known principles of phase stability, the control current $I_s$ is preferably bipolar, for example a square waveform as shown in FIG. 6 or alternatively a sinusoidal waveform. In either case current $I_s$ is applied so that the zero crossing of the bipolar waveform coincides in time with the desired location of the vortex. That is, the zero crossing occurs at a time when the desired vortex location is at the point of application of $I_s$. This embodiment has the advantage of fabrication simplicity as compared with the one incorporating fixed memory locations and for that reason may be preferred.

One important aspect of both of these memory systems is the function of N segment 62 in suppressing the creation of anti-vortices. An anti-vortex has the same characteristics as a vortex but opposite in sign. Thus, its associated supercurrent and magnetic field are opposite in direction to those of a vortex. As a consequence, when a vortex and anti-vortex attempt to occupy the same region of a weak-link structure they annihilate one another.

In a closed loop of the type shown in FIG. 6, but with N segment 62 replaced by superconductive material, input source 71 would simultaneously create a vortex propagating around the loop in one direction (e.g., clockwise) and an anti-vortex propagating in the opposite direction. At some point in loop the two would meet and annihilate one another. To avoid annihilation N segment 62 interrupts upper superconductive layer 64. As before, segment 62 could also interrupt lower layer 66 or both layers. The function of the N segment 62 is to prevent the formation of anti-vortices, or equivalently to dissipate those which do form. Thus, input source 71 generates a vortex (such as 72) which propagates clockwise, but the corresponding anti-vortex will be dissipated by N segment 62 provided the rate of change of $I_i$ is long relative to the anti-vortex dissipation time which is the same as $\tau$ given by equation (10).

On the other hand, the N segment 62 should be designed, using the previously given energy conditions, to allow the vortices propagating clockwise to traverse the N segment 62 without being totally dissipated. In this regard, synchronous source 82 may also serve as an amplifier to restore to vortices kinetic energy lost in traversing the N segment.

In either embodiment, dynamic or quasi-static, means must be provided to detect the vortices in the loop, i.e., in order to extract the information in the loop. One such detector, shown in exaggerated size in FIG. 6, is a SQUID comprising a pair of appendages 88 and 90 extending from lower superconductor 66. Overlaying the appendages is another superconductive strip 92. In the region of overlap between strip 92 and appendages 88 and 90 there are formed weak-links, e.g., thin insulative layers 87 and 89. A voltmeter 94 is connected between strip 92 and one of the appendages (e.g., 90). In operation, when a vortex 96 passes through the portion of line 60 between appendages 88 and 90, part of its magnetic flux is coupled (through mutual inductance) to the SQUID thereby altering its critical supercurrent in well-known fashion and causing a voltage output on meter 94. Thus, the presence of a vortex in a particular memory location is detected. Of course, the absence of a vortex would give no voltage indication on meter 94. Which location is in fact being read out can be determined by use of timing pulses and electronic circuitry well known in the art.

The amount of energy extracted from a vortex by the detector should in general be kept relatively small so that the vortex is not severely reduced, i.e., so much so that it might be dissipated by N segment 62 or produce an inadequate signal-to-noise ratio. This problem can be alleviated by suitable design of the detector, especially the mutual inductance between line 60 and the SQUID, or by incorporation of an amplifier in the loop. Once again synchronous source 82 can perform the amplifying function.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention.

Figure 7B:
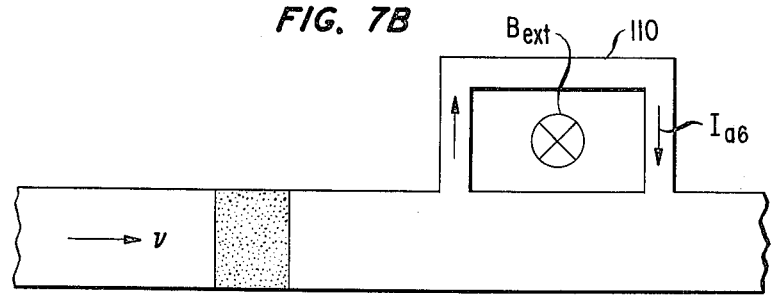
FIG. 7B is a schematic top view of yet another embodiment of our invention for generating the control current of FIG. 7A by means of an external magnetic field.

In particular, control currents may be applied directly across a transmission line from a current source, as shown in FIGS. 2 and 3, or may be applied in the plane of one of superconductive layers as shown in FIGS. 7A and 7B. In FIG. 7A the upper superconductive layer 100 of a supercurrent transmission line is interrupted by N segment 102 adjacent which are a pair of superconductive appendages 104 and 106. A current source 108 is connected across the appendages to produce a control current $I_{a5}$. Alternatively the appendages may be joined to form a U-shaped loop 110 as shown in FIG. 7B. An external magnetic field $B_{ext}$ (from a source not shown) penetrates the loop interior and induces in the loop 110 a control current $I_{a6}$ which functions in the same manner as $I_{a5}$ of FIG. 7A.

In both FIGS. 7A and 7B it should be noted that the control currents do not flow only in the plane of the top superconductor. Rather they flow through the weak-link layer and in the plane of the lower superconductor as well. In fact, it is the component of the control current which flows normal to layered structure (e.g., in FIG. 7A into the plane of the paper at point 105 and out at point 103) which interacts with the corresponding component of the vortex supercurrent and either attracts or repels the vortex. Consequently, the embodiments, of FIGS. 7A and 7B differ from those of FIGS. 2 and 3 because the former have two transverse current components, one of which attracts and the other of which repels a vortex (e.g., attract at point 103 of FIG. 7A but repel at point 105), whereas the latter supply at any given point and time only unidirectional control current which may either attract or repel a vortex but not both.

In FIG. 7B, the source of $B_{ext}$ may conveniently be a vortex in an adjacent transmission line (not shown) in which case the magnitude of $B_{ext}$ would depend on the mutual inductance between the two lines. If the mutual inductance is large enough to induce adequate control currents, the loop 110 may be omitted. In the latter case, $B_{ext}$ would induce the control current directly in the transmission line.

Figure 8:
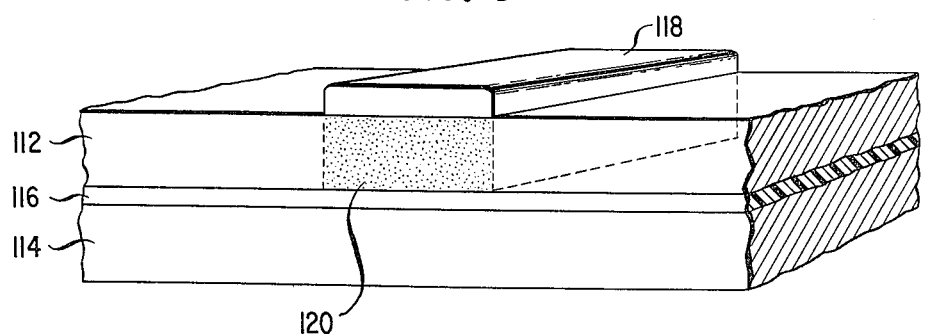
FIG. 8 is a schematic pictorial view of an overlay structure for producing the normal metal segment of the control means in accordance with another embodiment of our invention.

Although, the N segment may be fabricated in a planar fashion as shown in FIGS. 1–3 using suitable masking techniques well known in the art, it may also be formed by taking advantage of the proximity and/or intermetallic effects. Thus, in FIG. 8 there is shown transmission line comprising planar superconductive layers 112 and 114 between which is sandwiched a thin weak-link layer 116. Overlaying the upper superconductive layer is a normal metal layer 118 in the form of a stripe. In the region 120 which underlies layer 118, the transition temperature of superconductive layer 112 is lower than the operating temperature of the device or system in which the transmission line is incorporated. The lowering of the superconducting transition temperature in region 120 may result either from the formation of an intermetallic compound between the metals of layer 112 and layer 118 or from the proximity effect, or both. Illustratively layers 112 and 114 comprise tin layers about 0.5 μm thick, weak-link layer 116 is a tin oxide layer about 20 Angstroms thick, and layer 118 is a gold layer about 0.5 μm thick.

Moreover, the N segment may be fabricated as shown in FIG. 9 where layers 120, 122 and 124 are superconductive, layer 126 is the weak-link and layer 128 is a normal metal. In this case, layers 122, 128 and 124 are formed on layer 126 in the order recited, resulting in a non-planar structure having small overlaps as shown. This structure may be useful if relatively small N segments with long decay times $\tau$ are desired.

Finally, each of the embodiments of our invention may be fabricated on, but insulated from, a superconducting ground plane, a technique well known in the art.

What is claimed is:

1. Superconductive apparatus comprising
a supercurrent transmission line which includes a pair of superconductive layers and a weak-link layer separating said superconductive layers and contigous therewith,
said line being adapted to support the propagation of mobile flux vortices therein and having a length, as measured in the direction of said propagation, which is much greater than the Josephson penetration depth $\lambda_J$,
characterized in that said apparatus includes means for changing the velocity of said vortices comprising
a normal metal segment which interrupts at least one of said superconductive layers in the direction of said propagation, and
control means for applying a control current in a region of said line in operative relation to said segment.

2. The apparatus of claim 1 wherein
said segment is adapted so that in the absence of said control current a vortex will be dissipated upon reaching said segment, and
said control means applies a control current pulse which increases the velocity of said vortex sufficiently to allow said vortex to propagate through said segment without being substantially dissipated.

3. The apparatus of claim 2 wherein said control means applies said control current to said line at a point between said segment and a vortex approaching said segment and in the same direction as the proximate portion of the circulating supercurrent of said vortex.

4. The apparatus of claim 2 wherein said control means applies said control current to said line at a point on the side of said segment remote from a vortex approaching said segment and in the same direction as the proximate portion of the circulating supercurrent of said vortex, the separation between said segment and said point being less about $2\lambda_J$ to $3\lambda_J$.

5. The apparatus of claim 1 wherein
said segment is adapted so that in the absence of said control current a vortex will not be substantially dissipated upon reaching said segment, and
said control means applies a control current pulse which decreases the velocity of said vortex sufficiently that said vortex cannot propagate through said segment.

6. The apparatus of claim 5 wherein said control means applies said control current to said line at a point between said segment and a vortex approaching said segment and in the opposite direction to the proximate portion of the circulating supercurrent of said vortex.

7. The apparatus of claim 1 wherein
said segment is adapted so that in the absence of said control current a vortex will not be totally dissipated upon traversing said segment initially, but will undergo a reduction in velocity, and
said control means applies a control current pulse to said line at a point on the side of said segment remote from a vortex approaching said segment and in the opposite direction to the proximate portion of the circulating supercurrent of said vortex, thereby to reflect said vortex back toward said segment where it is dissipated.

8. The apparatus of claim 1 wherein said control means is adapted to apply said control current across said line and transverse to the plane of said layers.

9. The apparatus of claim 8 wherein said control means includes
a superconductive loop electrically coupled to at least one of said superconductive layers to form a closed current path which includes said region in operative relation to said segment, and
means for producing a magnetic field the flux lines of which are linked to said loop so that said control current is induced in said path.

10. The apparatus of claim 1 further including a normal metal strip which overlays said at least one superconductive layer and forms thereunder said normal metal segment by virtue of intermetallic diffusion and/or the proximity effect between said strip and said layer.

11. The apparatus of claim 1 wherein
said transmission line is bifurcated into two separate supercurrent transmission paths,
said control means includes a normal metal segment in each of said paths and means for selectively applying control currents in regions of said paths in operative relation to said segments so that a vortex propagating in said line can be made to propagate in selected ones of said paths.

12. The apparatus of claim 1 wherein said control means further includes a portion of said line in which the width thereof is different from the remainder of said line so that a vortex traversing said portion experiences a transfer between its potential and kinetic energies.

13. The apparatus of claim 12 wherein said normal metal segment is located in said portion.

14. Superconductive apparatus comprising
a supercurrent transmission line which includes a pair of superconductive layers and a weak-link layer separating said superconductive layers and contiguous therewith,
said line being adapted to support the propagation of mobile flux vortices therein and having a length, as measured in the direction of said propagation, which is much greater than the Josephson penetration depth $\lambda_J$,
characterized in that:
said line is formed in the shape of a closed loop,
means are provided for generating vortices in said line at spaced intervals,
a normal metal segment interrupts at least one of said superconductive layers and is adapted to prevent the propagation of anti-vortices in said line,
means are provided for maintaining constant the relative positions of said vortices with respect to one another, and
means are provided for detecting the presence of said vortices in said loop.

15. The apparatus of claim 14 wherein said maintaining means comprises means for establishing fixed preferred locations at which said vortices can reside and means for causing said vortices to shift from one location to another.

16. The apparatus of claim 14 wherein said maintaining means comprises means for applying to said line current pulses for adjusting the velocities of said vortices, said pulse being applied synchronously with said vortices and at a frequency which is an integral multiple of the inverse of the loop transit time.

17. The apparatus of claim 16 wherein said maintaining means comprises means for applying bipolar current pulses so that the zero crossing of said pulses coincides in time with the desired locations of said vortices.

* * * * *